(12) United States Patent
Cervantes et al.

(10) Patent No.: US 7,519,889 B1
(45) Date of Patent: Apr. 14, 2009

(54) SYSTEM AND METHOD TO REDUCE LBIST MANUFACTURING TEST TIME OF INTEGRATED CIRCUITS

(75) Inventors: Daniel W. Cervantes, Round Rock, TX (US); Joshua P. Hernandez, Paige, TX (US); Tung N. Pham, Austin, TX (US); Timothy M. Skergan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/060,339

(22) Filed: Apr. 1, 2008

(51) Int. Cl.
*G01R 31/28* (2006.01)

(52) U.S. Cl. ............... 714/733; 714/25; 714/30; 714/724; 714/726; 714/727; 714/728; 714/729; 714/732; 714/734; 714/735; 714/736; 714/738; 714/739

(58) Field of Classification Search ............ None
See application file for complete search history.

(56) References Cited

U.S. PATENT DOCUMENTS

| 6,041,429 | A * | 3/2000 | Koenemann ........... 714/738 |
| 6,807,646 | B1 * | 10/2004 | Williams et al. ......... 714/736 |
| 6,950,974 | B1 * | 9/2005 | Wohl et al. ............. 714/733 |
| 6,993,694 | B1 * | 1/2006 | Kapur et al. ............ 714/733 |
| 7,237,162 | B1 * | 6/2007 | Wohl et al. ............. 714/726 |
| 7,284,176 | B2 | 10/2007 | Wang et al. |
| 7,346,823 | B1 * | 3/2008 | Maheshwari et al. ...... 714/733 |
| 2004/0128599 | A1 * | 7/2004 | Rajski et al. ............ 714/726 |
| 2007/0214398 | A1 * | 9/2007 | Zhang et al. ............ 714/728 |

OTHER PUBLICATIONS

Al-Yamani et al., "Built-in Reseeding for Serial Test", IEEE VLSI Test Symposium, 2003, 6 pages.*
Al-Yamani et al., "BIST Guided ATPG", IEEE Symposium on Quality Electronic Design, 2005, 6 pages.*

* cited by examiner

*Primary Examiner*—John P Trimmings
(74) *Attorney, Agent, or Firm*—Cantor Colburn LLP; Cas Salys

(57) ABSTRACT

A method to reduce logic built in self test manufacturing test time of integrated circuits, comprising: loading a plurality of test seeds in bulk into a locally accessible on-chip memory array locally disposed on an integrated circuit, each of the plurality of test seeds is associated with a set of LBIST control information; sending the plurality of test seeds from the locally accessible on-chip memory array repetitively into a pseudo-random pattern generator one at a time during an LBIST operation being under the control from the set of LBIST control information; generating random bit streams serially into a plurality of parallel shift registers of the integrated circuit through the use of the plurality of test seeds; and performing a logic built-in self test on a plurality of logic blocks in the integrated circuit to detect defects within the integrated circuit.

4 Claims, 3 Drawing Sheets

SYSTEM AND METHOD TO REDUCE LBIST MANUFACTURING TEST TIME OF INTEGRATED CIRCUITS

BACKGROUND OF THE INVENTION

1. Field of the Invention

This invention relates to a system and method for reducing LBIST manufacturing test time of integrated circuits.

2. Description of Background

Logic Built In Self Testing (LBIST) is relied upon to screen defects in particular AC or high-speed defects. Defects may include, for example, improper cleaning of level-to-level contact etching. To achieve test coverage, many setup configurations are used to achieve test coverage, for example, weight sets, array interface path selections, skewed versus unskewed scanning techniques, phase clocking sequences. For each instance, defect coverage is initially relatively excitingly high, but decreases with run time statistically as the self-generated patterns move in the "been-there/done-that" category. But occasionally a pattern is generated that provides unique defect coverage and fault grading identifies those patterns along with the corresponding pseudo-random pattern generator (PRPG) seed. Reloading and restarting LBIST with PRPG seeds that provide unique defect coverage adds to the manufacturing test time, but often this current approach of re-seeding PRPG does in fact reduce overall test time relative to having to extend the LBIST run-time. However, the reseeding overhead is still costly in terms of tester time because of the thousands and in some cases tens of thousands of LBIST reloads and restarts that is needed to cleanup the remaining though to detect defects.

SUMMARY OF THE INVENTION

The shortcomings of the prior art are overcome and additional advantages are provided through the provision of a method to reduce logic built in self test manufacturing test time of integrated circuits, comprising: loading a plurality of test seeds in bulk into a locally accessible on-chip memory array locally disposed on an integrated circuit, each of the plurality of test seeds is associated with a set of LBIST control information, the set of LBIST control information for each plurality of test seeds is loaded into the locally accessible on-chip memory array; sending the plurality of test seeds from the locally accessible on-chip memory array repetitively into a pseudo-random pattern generator one at a time during an LBIST operation being under the control from the set of LBIST control information; generating random bit streams serially into a plurality of parallel shift registers of the integrated circuit through the use of the plurality of test seeds; and performing a logic built-in self test on a plurality of logic blocks in the integrated circuit to detect defects within the integrated circuit.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution to reduce LBIST manufacturing test time of integrated circuits.

BRIEF DESCRIPTION OF THE DRAWINGS

The subject matter which is regarded as the invention is particularly pointed out and distinctly claimed in the claims at the conclusion of the specification.

The foregoing and other objects, features, and advantages of the invention are apparent from the following detailed description taken in conjunction with the accompanying drawings in which.

Figure 1:
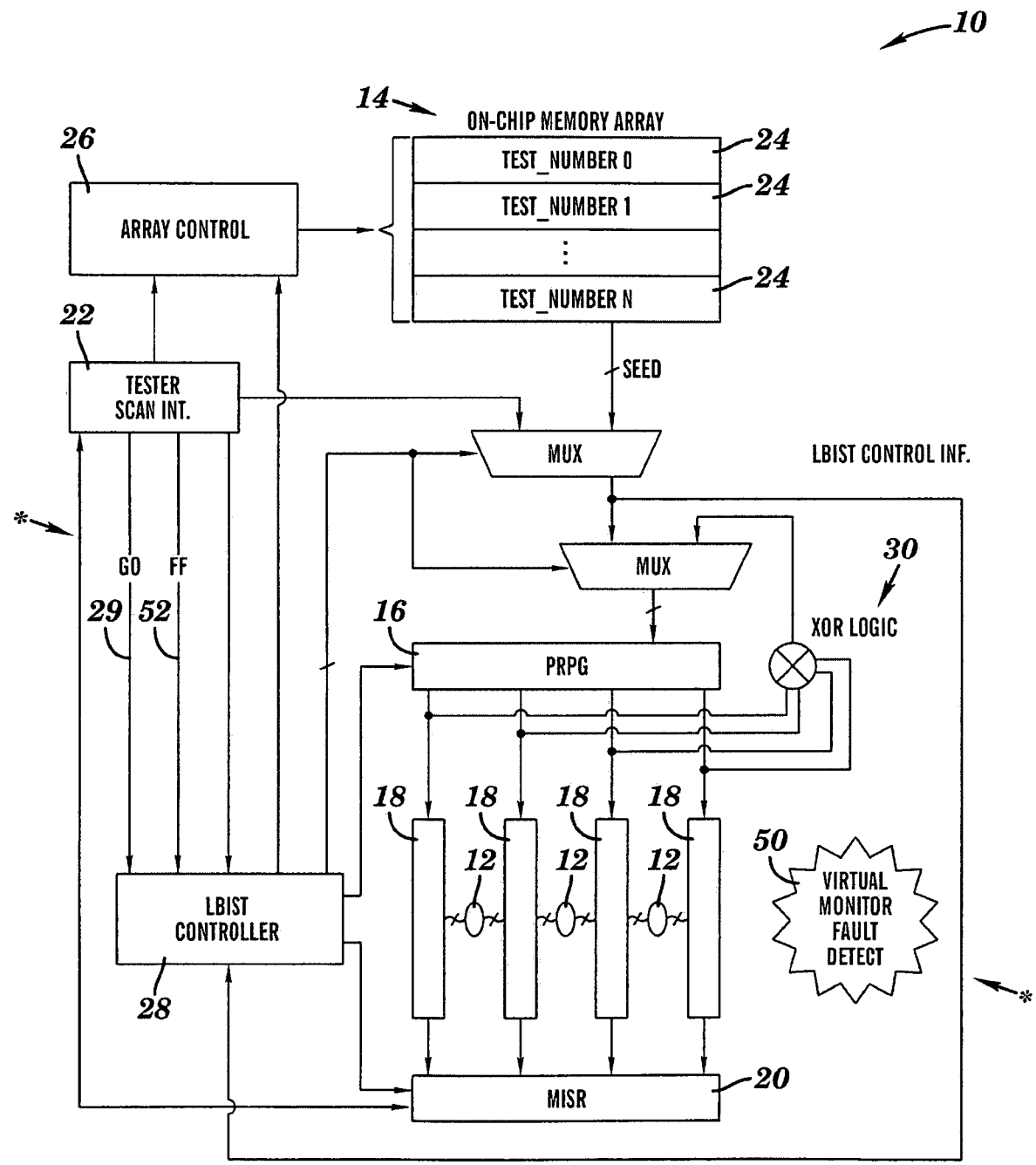
FIG. 1 is a schematic block diagram illustrating an integrated circuit chip in accordance with one exemplary embodiment of the present invention.

The detailed description explains the preferred embodiments of the invention, together with advantages and features, by way of example with reference to the drawings.

DETAILED DESCRIPTION OF THE INVENTION

The present invention and the various features and advantageous details thereof are explained more fully with reference to the non-limiting embodiments that are illustrated in the accompany drawings and detailed in the following description. It should be noted that the features illustrated in the drawings are not necessarily drawn to scale. Descriptions of well-known or conventional components and processing techniques are omitted so as to not necessarily obscure the present invention in detail. The examples used herein are intended merely to facilitate an understanding of ways in which the invention may be practiced and to further enable those of skill in the art to practice the invention. Accordingly, the examples should not be construed as limiting the scope of the invention.

The inventors herein have recognized a system and method that reduces LBIST reloads and restarts that are needed to cleanup the remaining tough-to-detect defects in integrated circuits. More specifically, the inventors herein have recognized that PRPG re-seeding and control updates by fast loading the list of unique PRPG seeds and other LBIST control directives in bulk into pre-existing locally accessible on-chip memory elements in integrated circuits, and subsequently and repetitively moving the PRPG seeds and control information from the on-chip memory elements into a pseudo-random pattern generator (PRPG) and LBIST controller will reduce many and possibly tens of thousands LBIST reloads and restarts needed to cleanup the remaining tough to detect defects in integrated circuits. The inventors herein have further recognized that using fast-forwarding techniques to advance the LBIST controls, for example the PRPG to use the next effective PRPG seed value, at a much higher clock rate than the actual LBIST scanning clock rate. These techniques include pausing the LBIST scanning of the integrated circuit during the PRPG fast-forwarding of, for example, the PRPG seed.

For a better understanding of the invention and its operation, turning now to the drawings, FIG. 1 is a schematic block diagram of an integrated device or integrated circuit chip or chip system 10 configured to receive test data (e.g., random test patterns) as a means for testing functional logic circuitry present on the chip or in the system. For illustrative purposes, functional logic circuitry present on the integrated circuit chip 10 is shown as a number of logic blocks or chip logic 12. An on-chip memory array 14 is locally disposed on the integrated circuit chip 10 and is in signal communication with a pseudo-random pattern generator (PRPG) 16 configured to generate and load random bit streams or random test patterns serially into a number of parallel shift registers 18 using scan-clock pulses, which in turn source the random test patterns using scan-clock pulses into the logic blocks 12. In doing so, a logic built-in self test (LBIST) is effectively performed on the logic blocks 12 of the integrated circuit chip 10, thereby exercising the effectiveness or testing the integrity of the integrated circuit chip 10.

In one exemplary embodiment, the results or output data of exercising the logic blocks 12 captured in the parallel shift registers 18 in a single clock cycle are XORed into a multiple input signature register (MISR) 20 using the scan-clock pulses, to generate a compressed signature representative of the test response collected from the parallel shift registers 18. In one exemplary embodiment, the contents of the compressed signature are compared with a reference (expected results) to determine if the integrated circuit chip 10 has passed or failed LBIST.

In accordance with one exemplary embodiment, the integrated circuit chip 10 includes a tester scan interface 22 configured to permit a test operator (e.g., circuit designer) to initialize the components (e.g., parallel shift registers) of the integrated circuit chip 10 to an initial state to begin LBIST operation though cascaded multiplexers coupled between the tester scan interface 22 and the PRPG 16. In one exemplary embodiment, the tester scan interface 22 is configured to initialize the on-chip memory array 14 and operatively load PRPG seeds or test seeds 24 and corresponding LBIST control information (e.g., duration of test) into the on-chip memory array 14 via an array controller 26. Other types of LBIST control information include PRPG weighting, PRPG enabling, clock sequencing schemes, skew versus unskewed end of scan loads, array write/read/bypass controls, power gating controls, etc. For reasons of clarity, references to PRPG seeds do not imply exclusion of the other types of LBIST control information. The tester scan interface 22 is configured to apply signals to an LBIST controller 28 to enable LBIST operation in the PRPG 16 and MISR 20 in accordance with one exemplary embodiment. Loading LBIST control information with the PRPG seed broadens the effectiveness of LBIST bringing an efficient method for managing dynamic, real-time control in order to reach state-spaces that include environmental conditioning. This eliminates the need for external assistance once all PRPG seeds and LBIST control information are loaded into the on-chip memory array 14 and LBIST operation is enabled.

In accordance with one exemplary embodiment, the on-chip memory array 14 is configured to hold an array of PRPG seeds 24 and LBIST control information provided by the tester scan interface 22. The tester scan interface 22 loads or writes the PRPG seeds 24 and LBIST control information associated therewith correspondingly in addresses of the on-chip memory array 14 via the array controller 26 during the initialization of the on-chip memory array 14 in a high clock speed. The initialization process iterates fast loading PRPG seeds 24 into the on-chip memory array 14 one address at a time, thereby loading the on-chip memory array 14 with PRPG seeds in bulk. The iteration continues until the on-chip memory array 14 is full or all the LBIST control information required has been loaded. For example, a first generated PRPG seed is loaded into a first address of the array 14, a second generated PRPG seed is loaded into a second address of the array, and so on until the array is filled with the required amount of PRPG seeds and LBIST control information. As PRPG seeds 24 are repetitively moved to the PRGP 16 during LBIST operation, the tester scan interface 22 can load additional PRPG seeds if more is warranted. The on-chip memory array 14 can be any conventional cache locally disposed on the integrated circuit chip 10 and can be of any size depending on the application. It is contemplated that more than one storage element may be used to hold effective information (PRPG seeds and LBIST control information) to send to the PRPG 16 and LBIST controller 28 when LBIST operation is enabled. In one exemplary embodiment, the on-chip memory array 14 is a pre-existing cache in the integrated circuit chip 10 used for non-related test purposes.

When the on-chip memory array 14 is initialized and loaded with PRPG seeds 24, LBIST operation can be initialized. LBIST operation is initialized through the tester scan interface 22 and effectively through the LBIST controller 28 via a "Go Signal", which is indicated by arrow 29, from the tester scan interface 22 in accordance with one exemplary embodiment. When LBIST is initialized, the tester scan interface 22 initializes the components (e.g., parallel shift registers) to an initial state. The "Go Signal" 29 from the tester scan interface 22 also instructs the LBIST controller 28 to begin LBIST operation.

During LBIST operation, the LBIST controller 28 controls the sequential operation of moving the PRPG seeds repetitively from the on-chip memory array 14 into the PRPG 16 based on LBIST control information and enabling the MISR 20 to accept the XORed results of testing the logic blocks 12 from the parallel shift registers 22 and compress the results into a unique signature. When one of the PRPG seeds 24 is moved to the PRPG 16, the PRPG 16 begins generating random test patterns, which are then captured using scan clock pulses into the parallel shift registers 18. The PRPG 16 generates the first of several random test patterns to be captured into the parallel shift registers 18 using one of the PRPG seeds moved from the on-chip memory array 14 to the PRPG 16. The first of several random test patterns from the PRPG 16 then loops through an XOR logic circuit 30 and fed back to the PRPG 16 to generate additional random test patterns for the parallel shift registers 18 to capture and subsequently test the logic blocks 12. Each generated random test pattern from the PRPG 16 continuously loops through the XOR logic circuit 30 and feeds back into the PRPG 16 N times. This looping cycle is determined by the LBIST control information associated with the PRPG seed loaded into the on-chip memory array 14 and moved into the PRPG 16.

Once the looping cycle is completed, the MISR 20 maintains the captured results and the LBIST controller 28 instructs the array controller 16 to retrieve the next effective PRPG seed 24 in the on-chip memory array 14 and to move the same into the PRPG 16 to create another set of random test patterns using the same operational steps as described above. This process is done until all PRPG seeds 24 from the on-chip memory array 14 are moved into the PRPG 16. It is contemplated that not all PRPG seeds 24 are moved to the PRPG 16 in other exemplary embodiments of the present invention. It is further contemplated that additional PRPG seeds 24 are generated and loaded into the on-chip memory array 14 during LBIST operation if more is warranted for testing purposes in other exemplary embodiments of the present invention.

When all required PRPG seeds 24 are moved into the PRPG 16 and the results from each test cycle is obtained in the MISR 20, the compressed signature of all the results is compared to reference data in order to determine if the integrated circuit chip 10 is defected via a simple single Pass/Fail criteria, which is valuable for high-throughput manufacturing production testing and device characterization.

In one exemplary embodiment, a fast-forwarding technique is implemented for advancing the PRPG 16 to or towards the next effective PRPG or LBIST control state at a much higher clock rate than the internal LBIST scanning clock rate. In one exemplary embodiment, a virtual monitoring device 50 is used to virtually monitor the PRPG outputs (random test patterns) and the detection of faults when such PRPG outputs are presented to the logic blocks 12 of the integrated circuit chip 10. The virtual monitoring device allows the operator to enable the fast-forwarding technique. The virtual monitoring device 50 comprises a central processing unit (CPU), which may be any conventional processor configured for carrying out the methods and/or functions described herein. In one exemplary embodiment, the CPU comprises a combination of hardware and/or software/firmware with a computer program that, when loaded and executed, permits the virtual monitoring device 50 to operate such that it carries out the methods described herein.

Figure 2:
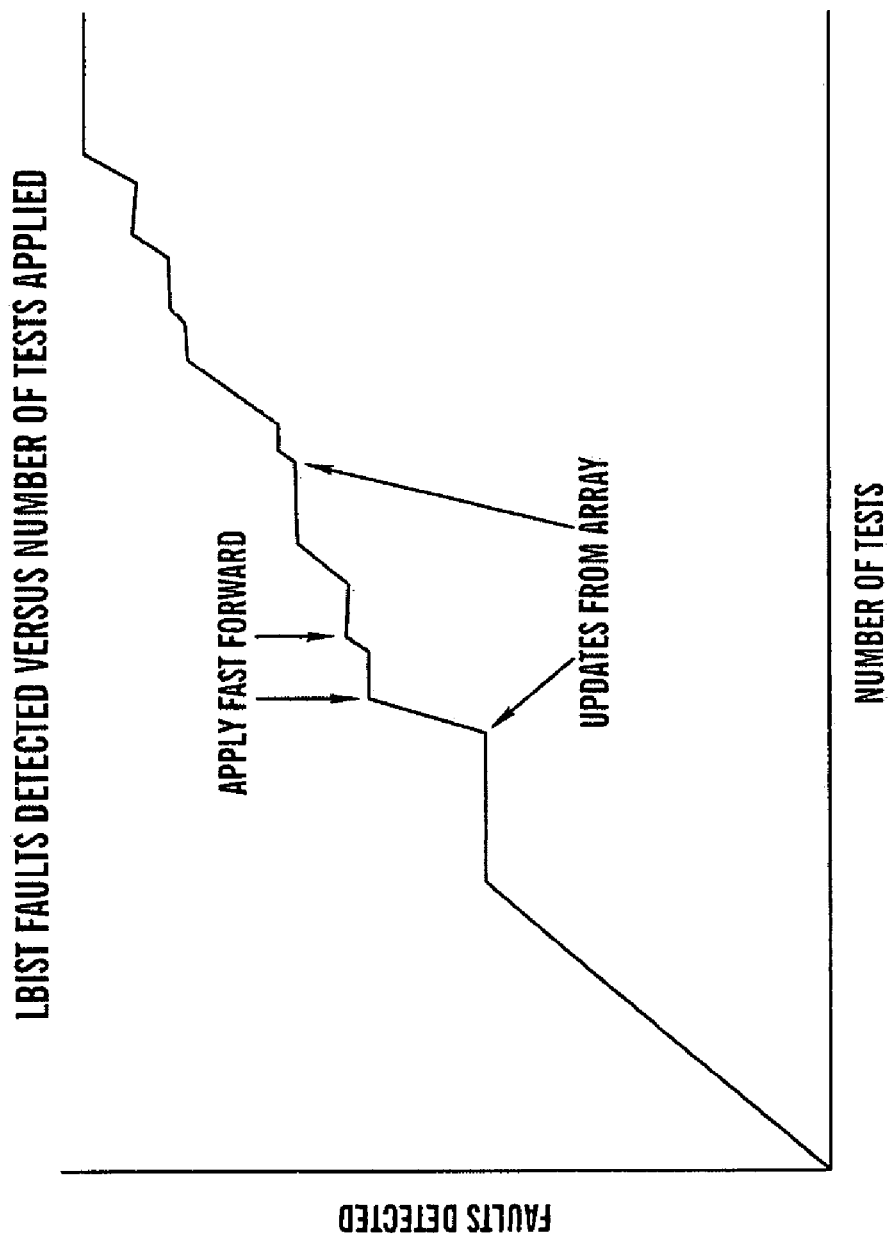
FIG. 2 is an exemplary graph illustrating LBIST faults detected versus a number of tests applied in accordance with one exemplary embodiment of the present invention.

By using behavioral modeling of the PRPG 16 and also the chip circuitry under expected or good operations and additionally under defective or faulty operations an exemplary graph as shown in FIG. 2 can be obtained. This behavioral modeling is conceptualized as the virtual monitoring device 50 in FIG. 1. The behavioral modeling of the PRPG 16 occurs by starting with the PRPG seed loaded into the PRPG 16 and computing in a virtual simulation environment the stream of bits (random test pattern) being fed back into the PRPG from the XOR logic circuit 30 and being fed down into the parallel shift registers 18. In a virtual simulation environment of the PRPG modeling, the test designer can determine with accuracy the contents of the parallel shift registers 18 at all times. At the time of the functional clocking, the contents of the parallel shift registers 18 can then be monitored virtually as propagating through the logic blocks 12 and back into the parallel shifts registers 18 themselves.

Furthermore, by determining through virtual simulation the response of the logic blocks 12 to a given test under expected or good operations and by determining additionally under defective or faulty conditions, a test designer can make the determination of whether that given applied test has detected any defects from faulty blocks of logic circuitry that were previously undetected.

For the cases of tests that do not detect any defects from faulty chip logic circuitry that were previously detected, that test can be skipped. For efficiency reasons, when more than one or a number of back-to-back tests are not detecting any additional defects, the test designer can create an entry into the on-chip memory array 14 for another test or PRPG seed. For the cases where only one or some limited number of back-to-back tests are not detecting any additional defects, the test designer can assert the tester scan interface 22 and send a "Fast-Forward" signal, which is indicated by arrow 52, to the LBIST controller 28 to effectively speed through those tests at a faster rate. In other words, using the PRPG example, the generation of random test patterns by the PRPG and XOR logic circuit is fast-forwarded such that some random test patterns are skipped and not presented to the parallel shift registers 18 or the logic blocks 12. This is made possible by suppressing the operations of the parallel shift registers 18 and by the allowance of the PRPG 16 to progress at the faster rate. The progress rate of the PRPG 16 when the fast-forwarding signal 52 is sent to the LBIST controller 28 can be in an order of magnitude faster than the rate allowed when sending the random test patterns from the PRGP 16 into and through the parallel shift registers and logic blocks 12. Using Fast-Forward signal 52 in conjunction with the bulk loaded next "best-test" entries of the locally disposed on-chip array element provides for the optimal LBIST test time.

Figure 3:
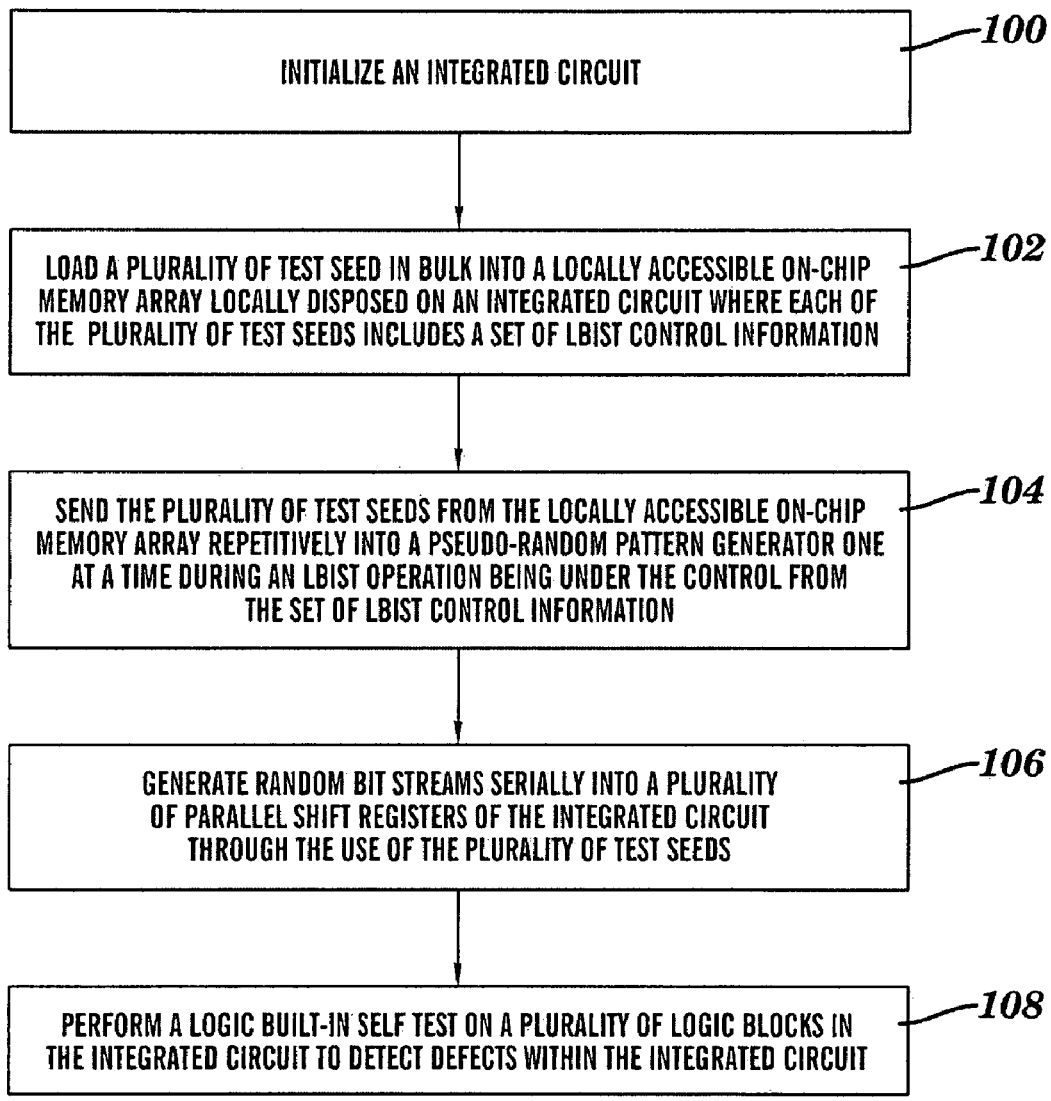
FIG. 3 is a data flow diagram of a method to reduce LBIST manufacturing test time in the integrated circuit.

Referring now to FIG. 3, a flowchart diagram is provided illustrating an exemplary method to reduce logic built in self test manufacturing test time of integrated circuits. In this exemplary method, initialize an integrated circuit at block 100. Then, load a plurality of test seed in bulk into a locally accessible on-chip memory array locally disposed on an integrated circuit where each of the plurality of test seeds includes a set of LBIST control information at block 102. In one exemplary embodiment, the set of LBIST control information for each plurality of test seeds is loaded into the locally accessible on-chip memory array. Next, send the plurality of test seeds from the locally accessible on-chip memory array repetitively into a pseudo-random pattern generator one at a time during an LBIST operation being under the control from the set of LBIST control information at block 104. At block 106, generate random bit streams serially into a plurality of parallel shift registers of the integrated circuit through the use of the plurality of test seeds. In block 108, perform a logic built-in self test on a plurality of logic blocks in the integrated circuit to detect defects within the integrated circuit. Optionally, generate a fast-forward signal during the generation of random bit streams initialized from one of the plurality of seeds sent to the pseudo-random pattern generator when no defects are being detected in the integrated circuit to fast-forward the generation of random bit streams, which effectively speeds through the generation of random bit streams at a faster rate. As such, another effective test seed can be moved into the pseudo-random pattern generator.

It should be understood that each block of the flowchart illustrations, and combinations of blocks in the flowchart illustrations, can be implemented by computer program instructions. These computer program instructions may be provided to a processor or other programmable data processing apparatus to produce a machine, such that the instructions, which execute on the processor or other programmable data processing apparatus create means for implementing the functions specified in the flow chart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustrations, and combination of blocks in the flowchart illustrations, can be implemented by special purpose hardware-based computer systems which perform the specified functions or steps, or by combinations of special purpose hardware and computer instructions.

Furthermore, the flowcharts are provided to demonstrate the operations performed within the illustrative embodiments. The flowcharts are not meant to state or imply limitations with regard to the specific operations or, more particularly, the order of the operations. The operations of the flowcharts may be modified to suit a particular implementation without departing from the spirit and scope of the present invention.

Advantageously, exemplary embodiments of the present invention broaden the effectiveness of LBIST bringing an efficient method for managing dynamic, real-time control in order to reach state-spaces that include environmental conditioning, unobtainable with prior techniques.

It is contemplated that performing the logic built-in self test on logic blocks 12 of the integrated circuit chip 10 may also determine timing, power, and temperature response characteristics within the integrated circuit chip 10 in accordance with other exemplary embodiments of the present invention.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided. The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method to reduce logic built in self test (LBIST) manufacturing test time of integrated circuits, the method comprising:

loading a plurality of test seeds in bulk into a locally accessible on-chip memory array locally disposed on an integrated circuit, each of the plurality of test seeds is associated with a set of LBIST control information, the set of LBIST control information for each of the plurality of test seeds is loaded into the locally accessible on-chip memory array, wherein the loading is provided at a same input;

sending the plurality of test seeds from the locally accessible on-chip memory array repetitively into a pseudo-random pattern generator one at a time during an LBIST operation being under the control from the set of LBIST control information;

generating random bit streams serially into a plurality of parallel shift registers of the integrated circuit through the use of the plurality of test seeds; and performing a logic built-in self test on a plurality of logic blocks in the integrated circuit to detect defects within the integrated circuit.

2. The method as in claim 1, wherein the locally accessible on-chip memory array sends one of the plurality of test seeds to the pseudo-random pattern generator to enable the pseudo-random pattern generator to generate the random bit streams serially into the plurality of parallel shift registers, the locally accessible on-chip memory array repetitively sends another one of the plurality of test seeds to the pseudo-random pattern generator when the pseudo-random pattern generator completes generating the random bit streams based on the set of LBIST control information associated with the one of the plurality of test seeds currently loaded into the pseudo-random pattern generator.

3. The method as in claim 2, wherein the pseudo-random pattern generator generates the random bit streams when the pseudo-random pattern generator is initialized by one of the plurality of seeds by continuously looping one random bit stream to another sequentially through an XOR logic circuit until another one of the plurality of seeds is sent to the pseudo-random pattern generator.

4. The method as in claim 2, wherein a fast-forward signal is generated during the generation of the random bit streams initialized from one of the plurality of seeds sent to the pseudo-random pattern generator when no defects are being detected in the integrated circuit to fast-forward the generation of the random bit streams effectively speeding through the generation of random bit streams at a faster rate while the operations of the plurality of parallel shift registers is suppressed when the fast-forward signal is enabled.

* * * * *